United States Patent [19]
Tehrani et al.

[11] Patent Number: 5,861,328
[45] Date of Patent: Jan. 19, 1999

[54] METHOD OF FABRICATING GMR DEVICES

[75] Inventors: Saied N. Tehrani, Tempe; Eugene Chen, Gilbert; Mark Durlam; Xiaodong T. Zhu, both of Chandler; Clarence J. Tracy, Tempe, all of Ariz.

[73] Assignee: Motorola, Inc., Schaumburg, Ill.

[21] Appl. No.: 723,438

[22] Filed: Oct. 7, 1996

[51] Int. Cl.⁶ .............................................. H01L 21/8238
[52] U.S. Cl. ............................ 438/210; 438/3; 438/131; 438/266; 438/688
[58] Field of Search .................... 438/3, 131, 266, 438/688; 365/98, 158, 171

[56] References Cited

U.S. PATENT DOCUMENTS

| | | | |
|---|---|---|---|
| 5,374,578 | 12/1994 | Patel et al. | 438/3 |
| 5,389,566 | 2/1995 | Lage | 438/3 |
| 5,567,636 | 10/1996 | Jones, Jr. | 438/3 |
| 5,659,499 | 8/1997 | Chen et al. | 365/158 |

*Primary Examiner*—Peter Toby Brown
*Assistant Examiner*—Khanh Duong
*Attorney, Agent, or Firm*—Eugene A. Parsons

[57] ABSTRACT

A method of fabricating GMR devices on a CMOS substrate structure with a semiconductor device formed therein. The method includes forming a dielectric system with a planar surface having a roughness in a range of 1 Å to 20 Å RMS on the substrate; disposing and patterning films of giant magneto-resistive material on the planar surface so as to form a memory cell; disposing a dielectric cap on the cell so as to seal the cell and provide a barrier to subsequent operations; forming vias through the dielectric cap and the dielectric system to interconnects of the semiconductor device; forming vias through the dielectric cap to the magnetic memory cell; and depositing a metal system through the vias to the interconnects and to the memory cell.

30 Claims, 6 Drawing Sheets

METHOD OF FABRICATING GMR DEVICES

FIELD OF THE INVENTION

The present invention pertains to methods of manufacturing high density, non-volatile magnetic memories integrated with CMOS processes and more particularly to improved methods of fabricating memories using giant magneto-resistive (GMR) materials as the memory element.

BACKGROUND OF THE INVENTION

At the present time, many attempts are being made to integrate high density, non-volatile magnetic memories with semiconductor devices. In particular, semiconductor devices, such as various CMOS circuits, can be used for switching and otherwise controlling arrays of high density, non-volatile magnetic memories. The CMOS circuits are highly desirable because of the low currents required and high efficiency.

However, CMOS fabrication processes require many high temperature processing steps (i.e., temperatures in excess of 800° C.). After metal interconnect layers are deposited the CMOS processing steps are limited in temperature to around 500° C. However, the deposition of dielectric and metal layers is improved at higher temperatures. Thus, it is desirable to use as high a temperatures as practical.

One problem in the integration of CMOS circuits with GMR memory devices is that giant magneto-resistive (GMR) materials used as memory elements are generally restricted to temperatures below 300° C. in order to prevent intermixing of the GMR materials. Also, the GMR materials contain elements which oxidize readily and which are sensitive to corrosion. Thus, the GMR materials must be protected from processes that oxidize or contain corrosive agents to magnetic materials.

Accordingly it would be highly desirable to provide an improved method of fabricating memories containing GMR materials with CMOS circuits.

It is a purpose of the present invention to provide a new and improved method of fabricating memories containing GMR materials.

It is another purpose of the present invention to provide a new and improved method of fabricating memories containing GMR materials in which the magnetoresistive ratio of the GMR materials is maximized.

It is still another purpose of the present invention to provide a new and improved method of fabricating memories containing GMR materials in which the GMR materials are protected from oxidizing and corrosive materials.

It is a further purpose of the present invention to provide a new and improved method of fabricating memories containing GMR materials in which the GMR materials are protected from high temperatures and corrosive materials commonly utilized in CMOS manufacturing processes.

SUMMARY OF THE INVENTION

The above problems and others are at least partially solved and the above purposes and others are realized in a method of fabricating magnetic memory devices including the steps of providing a substrate structure having a surface, forming a dielectric system on the surface, the dielectric system being formed with a planar surface having a roughness in a range of 1 Å to 20 Å RMS and a maximum roughness of 50 Å, and disposing and patterning films of giant magneto-resistive material on the planar surface of the dielectric system so as to form at least one magnetic memory cell.

Also, in embodiments incorporating a field effect transistor with a silicon gate and silicon oxide gate insulator and utilizing plasma processing, a forming gas anneal is performed on the substrate structure and dielectric system prior to the step of disposing and patterning films of giant magneto-resistive material. The anneal ties up dangling bonds at the silicon/silicon oxide interface and recovers damage from plasma processing done to the gate.

BRIEF DESCRIPTION OF THE DRAWINGS

Referring to the drawings.

DESCRIPTION OF THE PREFERRED EMBODIMENTS

Figure 1:
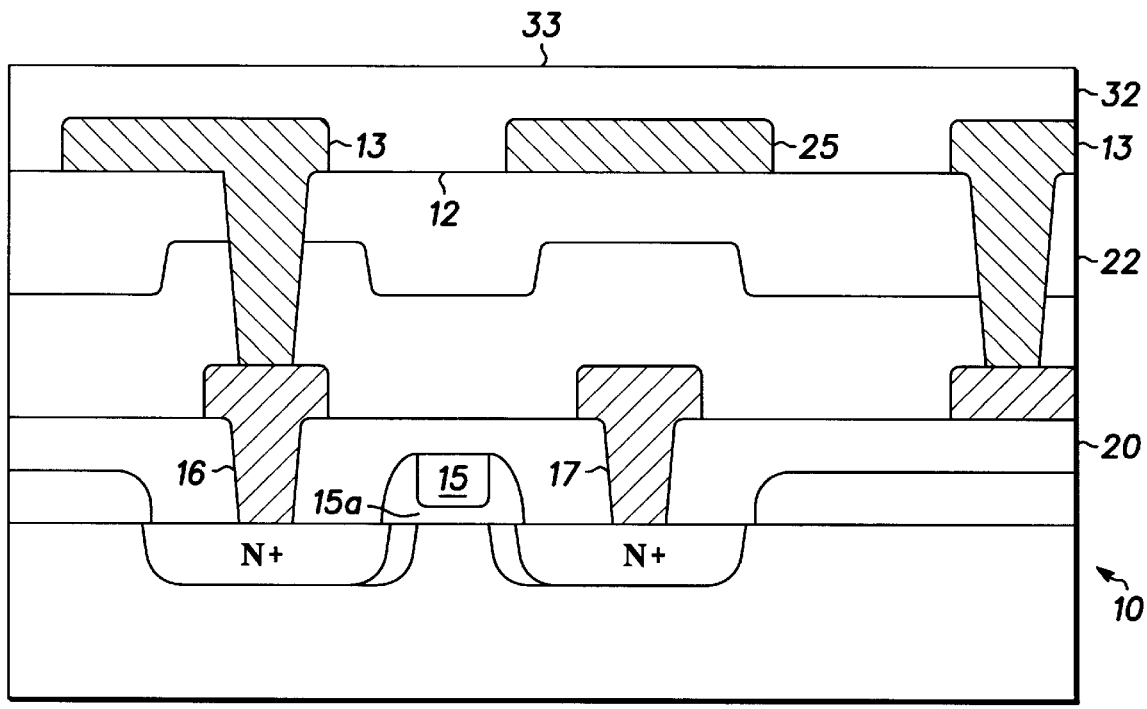
FIGS. 1 through 8 are simplified sectional views illustrating several steps in a method of fabricating magnetic memory devices in accordance with the present invention.

Turning now to the drawings, FIGS. 1 through 8 are simplified sectional views illustrating several steps in a method of fabricating magnetic memory devices in accordance with the present invention. Referring specifically to FIG. 1, a substrate structure 10 with a semiconductor device 11 formed therein is illustrated. Substrate structure 10 has a surface 12 with metal interconnects 13, connected to semiconductor device 11. In this specific embodiment semiconductor device 11 is a metal-oxide-silicon field effect transistor (MOSFET) with a gate terminal 15, a drain terminal 16 and a source terminal 17. While a MOSFET is illustrated herein for convenience, it will be understood by those skilled in the art that many other types of semiconductor devices could be provided. Also, while a single semiconductor device is illustrated for convenience it should be understood that substrate structure 10 represents a complete circuit and may be, for example, a complete array of devices or control/driver circuits around the periphery of an array of magnetic memory cells. Further, FIG. 1 and the following figures are cross-sectional views but it should be understood that gate terminal 15 and source terminal 17 extend into and out of the drawing so that appropriate connections are made, for example, at the ends of longitudinally extending metal leads.

Drain and source terminals 16 and 17 extend upwardly to the surface of a silicon oxide or silicon nitride layer 20 formed on the surface of semiconductor device 11 in a standard CMOS step generally referred to as a first metal step. In this description, additional dielectric layers 22 are added to provide surface 12 for metal interconnects 13 and a bottom word line section 25 formed thereon. Metal interconnects 13 are generally connected to drain terminal 16 by means of vias 18, which are all provided in a step in the CMOS process referred to as the second metal step. Metal interconnects 13 and bottom word line section 25 can be deposited by some convenient technique, such as plasma enhanced chemical vapor deposition (PECVD) or physical vapor deposition (PVD). In addition, interconnects 13, in this specific embodiment, are connected to bottom word line section 25, which requires the addition of dielectric layers 22 to separate interconnects 13 and word line 25 from gate and source terminals 15 and 17. The purpose and connection of bottom word line section 25 will be described in more detail presently.

As will be understood presently, a single (top or bottom) section or a helical word line can be used and the number of metal and dielectric deposition steps will depend upon the specific embodiment desired. It will of course be understood that interconnects 13 and word line section 25 can be formed in a variety of ways but generally, up to this point the fabrication will be accomplished in accordance with standard CMOS techniques. Also, while normal CMOS processes require many high temperature processing steps, i.e. temperatures in excess of 800° C., after metal interconnect layers are deposited the processing steps are generally limited in temperature to around 500° C. As is known by those skilled in the art, the deposition of dielectric and metal layers is improved at higher process temperatures.

Figure 2:
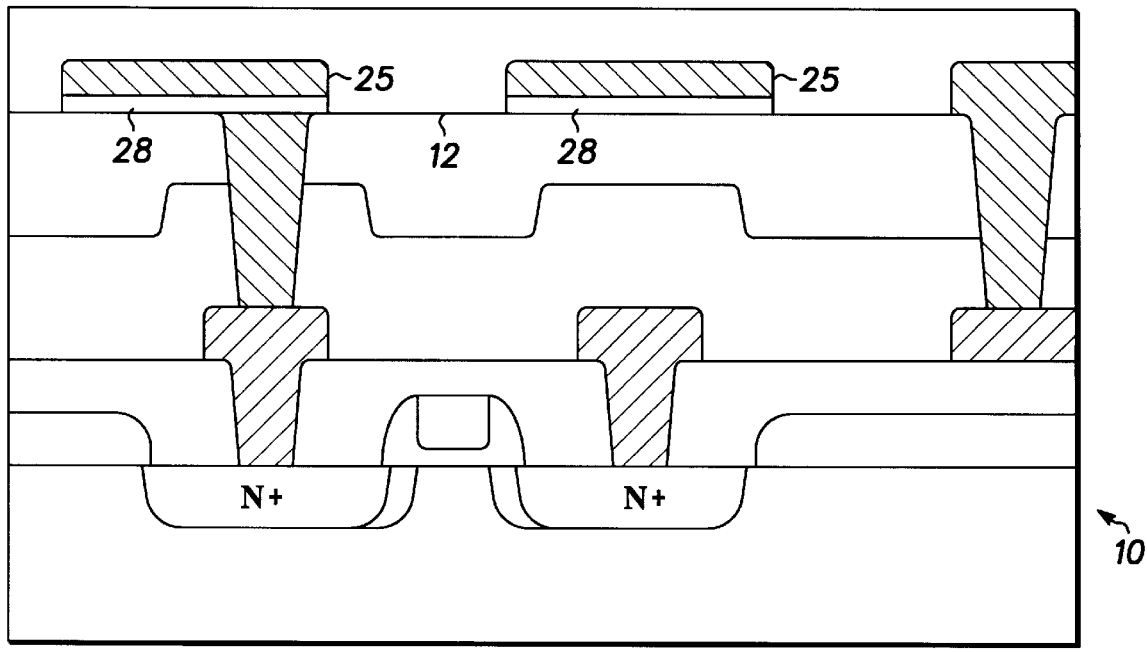

As illustrated specifically in FIG. 2 in a slightly different embodiment of the magnetic memory device, a flux concentrating layer 28 of high permeability magnetic material is positioned on surface 12 of substrate structure 10 prior to the deposition of interconnects 13 and bottom word line section 25. Flux concentrating layer 28 has the characteristic of concentrating magnetic flux produced by word line section 25 in the area desired and, therefore, reduces the amount of current required to produce the desired action. Generally, flux concentrating layer 28 is deposited on surface 12 first and then a conventional metalization scheme is used to deposit interconnects 13 and word line section 25. Flux concentrating layer 28 is an electrically conducting magnetic material having high permeability, such as NiFe, CoZrTa, or any suitable material having sufficiently high permeability to concentrate the magnetic flux in the desired area and metallurgically compatible with the materials of interconnects 13.

Figure 3:
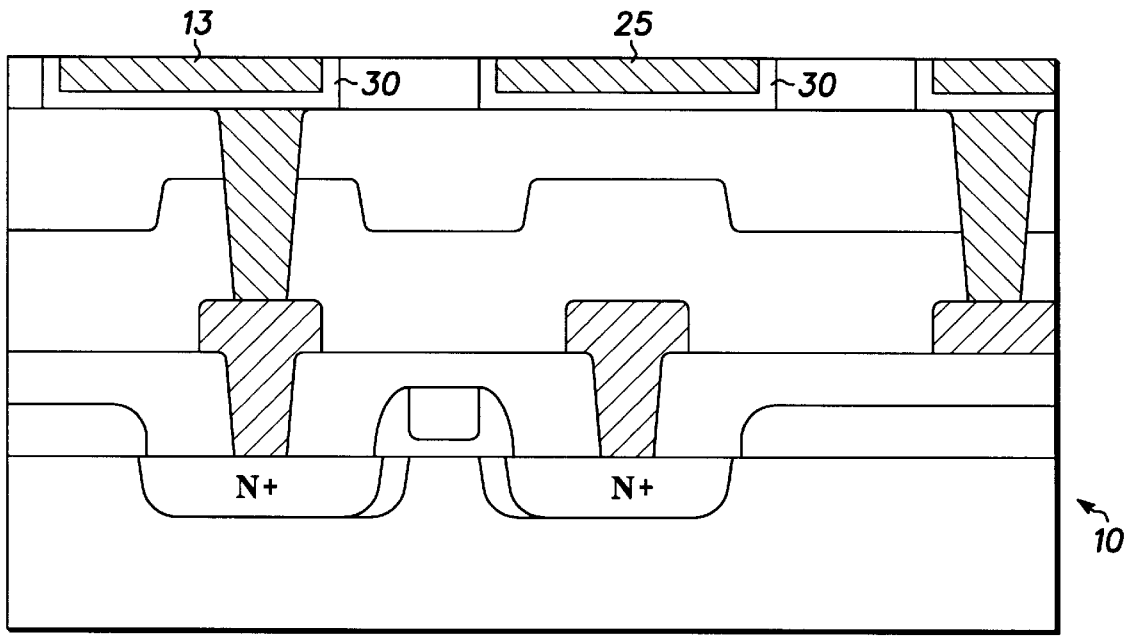

Another embodiment of the magnetic memory device is illustrated in FIG. 3 wherein a flux concentrating structure 30 of high permeability magnetic material is positioned on three sides of interconnects 13 and bottom word line section 25. In this embodiment a damascene or inlaid metal process is used to form structure 30. Generally, the damascene process is used in conjunction with a conventional plug technology for filling via holes. After completing the plug steps (vias 18), dielectric layers (not shown) are deposited. These dielectric layers are of different composition such that etch selectivity exists between two or more of the layers. Examples of dielectric stacks are $SiO_2$ over $Si_3N_4$, or a three layer stack consisting of $SiO_2$ over an etch stop layer, such as AlN or $AlO_3$, over $Si_3N_4$. A resist pattern is formed over the dielectric stack using conventional lithography. The dielectric is etched such that the top dielectric layer is etched where it is exposed by the resist mask. The etch is stopped in the bottom layer or the etch stop layer if that is used. A separate etch is then used to expose the vias 18. This etch creates a form or trench for the deposition of flux concentrating structure 30. Several metal systems are compatible with the flux concentrating layers or structure, such as, for example, Al—Cu and Cu. The Al—Cu metal system can be deposited by PVD directly over flux concentrating structure 30. The Cu metal system generally requires a barrier layer, followed by a Cu seed layer usually deposited by PVD. Then either CVD Cu or plated Cu is deposited. The metal is removed in the regions above the trench by chemical mechanical polishing (CMP) or the like.

With surface 12, interconnects 13 and bottom word line section 25 in place, a dielectric system 32 is disposed thereon to define a planar surface 33. Generally, in magnetic memory cells using GMR materials, the sensing of stored states utilizes a difference or ratio between the magnetoresistance in two different states. To reduce the complexity of sensing circuitry and to improve accuracy and reliability it is necessary that this magnetoresistive ratio be as high as possible. To achieve the highest possible magnetoresistive ratio from the GMR material in a magnetic memory cell, it has been found that the surface on which the GMR material is deposited must meet certain roughness requirements. Specifically, the roughness of surface 33 of dielectric system 32 should be in a range of 1 Å to 20 Å RMS or a maximum of approximately 50 Å. An acceptable method of achieving this smoothness is dielectric chemical mechanical polishing (CMP) or CMP followed by deposition of more dielectric material. In addition, dielectric system 32 should have properties relating to barriers for moisture and oxidation. Suitable materials which provide these characteristics are, for example, $Si_3N_4$ or $SiO_2$ as deposited by PECVD or PVD. Additional layers may be provided in dielectric system 32 to enhance the magnetoresistive performance of the GMR material, such as AlN, AlO, or NiO.

Once dielectric system 32 is properly deposited and prepared, a forming gas anneal is optionally performed. The anneal is especially desirable in devices incorporating MOSFETs and the like for setting the transistor characteristics, as will be understood presently. It is important to note that if the final layers of dielectric system 32 are barriers to hydrogen (e.g., $Si_3N_4$) the forming gas anneal should be done prior to their deposition. Generally, as will be understood by those skilled in the art, gate terminal 15 of semiconductor device 11 (see FIG. 1) is formed of silicon on a thin layer 15a of gate oxide (e.g., $SiO_2$). During subsequent processing, radiation can create dangling bonds leading to states at the critical $SiO_2$/silicon interface which can hold charge and change the semiconductor device characteristics. The forming gas anneal passivates the dangling crystalline. The forming gas anneal is usually done at a temperature range of 390° C. to 450° C. in a hydrogen atmosphere for 15 minutes to 30 minutes. The forming gas anneal steps are too high for GMR material so, if a forming gas anneal is performed, the steps must be done prior to deposition of the GMR material.

Figure 4:
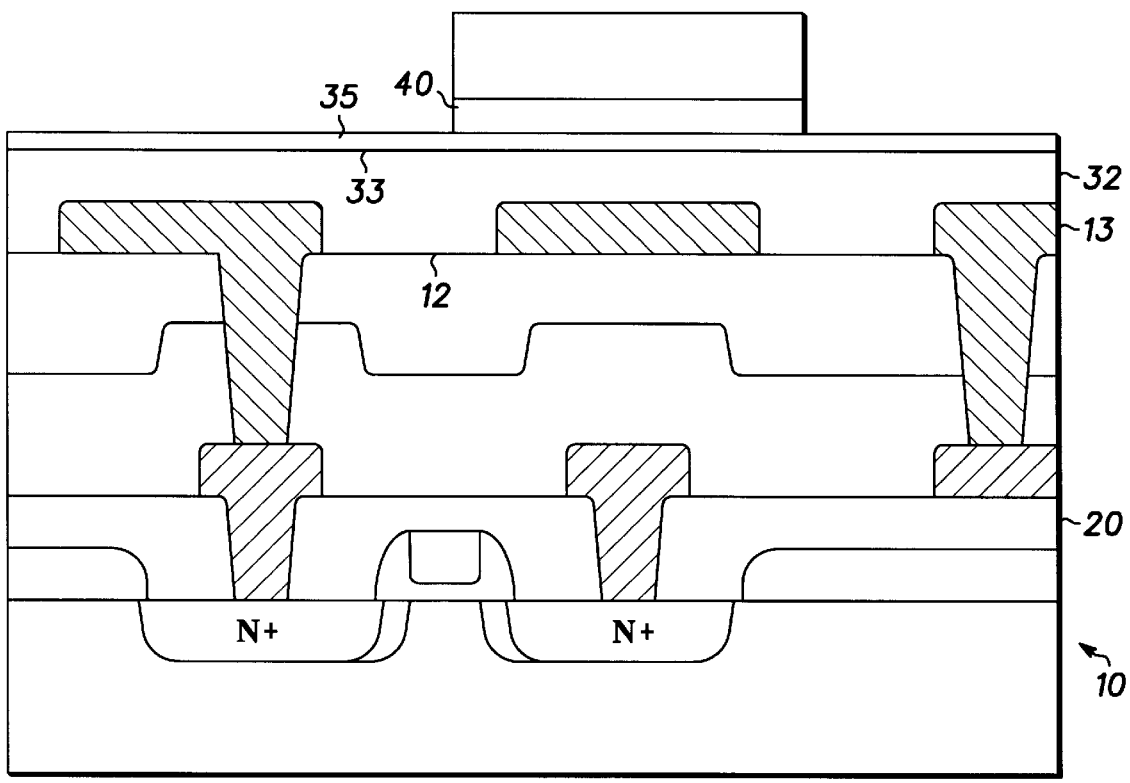
Figure 5:
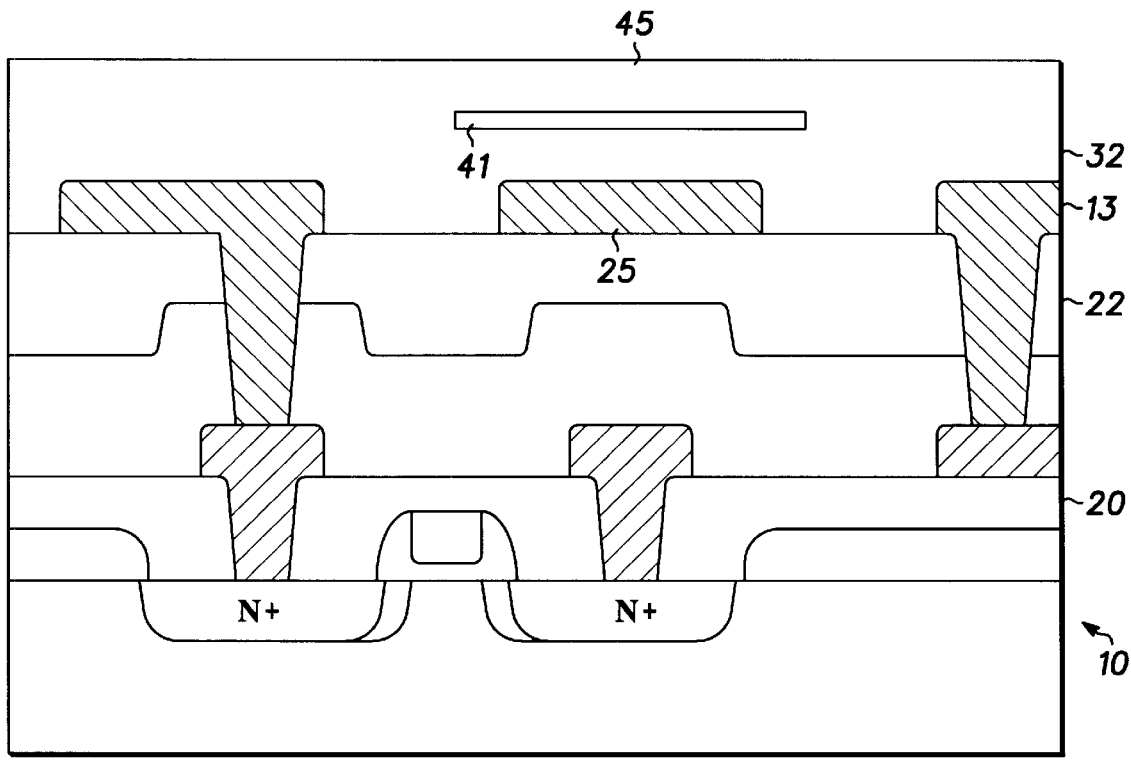

Films of giant magneto-resistive material, represented by a single GMR layer 35 for simplicity, are deposited on planar surface 33 of dielectric system 32 so as to form at least one magnetic memory cell. GMR layer 35 is deposited by one of several methods including, PVD, MBE, IBD, or the like. GMR layer 35 is deposited in a blanket layer and hard mask material 40 is deposited thereover and patterned to define the desired magnetic memory cell or cells, as illustrated in FIG. 4. Generally, a protective layer of material, such as a Ta cap or the like, is deposited over GMR layer 35 in situ (without removing the device from the deposition chamber) and is illustrated herein as a portion of GMR layer 35. The protective layer protects the GMR material from ambient conditions during deposition of hard mask material 40. Hard mask material 40 is patterned and etched using conventional photolithography and reactive ion etch (RIE) techniques. The properties of hard mask material 40 are such that a barrier is formed to moisture and oxidation, in addition to the required masking characteristics. Suitable materials are silicon nitride deposited using low temperature techniques, such as PECVD or PVD. After patterning hard mask materials 40, unmasked portions of GMR layer 35 are removed by either ion milling or wet etching to form GMR memory element (cell), or elements, 41, as illustrated in FIG. 5. Suitable wet etches are, for example, diluted nitric or sulfuric acid. Because GMR memory element 41 is not connected to any semiconductor devices at this point, no charge collection by antenna structures, or similar techniques, are required during the patterning of GMR layer 40.

After patterning GMR layer 40 to form GMR memory elements 41, a dielectric cap 45 is disposed on magnetic memory element 41, as illustrated in FIG. 5. Cap 45 is provided to seal GMR memory element 41 and provide a barrier to moisture, oxidation, and corrosive agents for subsequent operations and permanent use. Dielectric cap 45 includes at least one barrier layer which, in conjunction with the barrier properties of dielectric system 32 beneath GMR memory elements 41, seals elements 41 in a substantially complete barrier. A suitable barrier layer is, for example, silicon nitride with a thickness in a range of 300 Å to 1000 Å. Another or second dielectric layer (illustrated herein as a portion of dielectric cap 45) is deposited over the barrier layer. The second dielectric layer is provided as a masking layer for etching the barrier layer. A suitable material for the second (top) dielectric layer is, for example, $SiO_2$ or the like with a thickness in a range of 500 Å to 4000 Å. A third layer (also illustrated herein as a portion of dielectric cap 45) is optionally provided between the barrier layer and the second dielectric layer to provide higher etch selectivity between the second and barrier layers of cap 45. A suitable etch stop layer to provide the desired etch selectivity is, for example, AlO or AlN with a thickness in a range of 100 Å to 500 Å.

Figure 6:
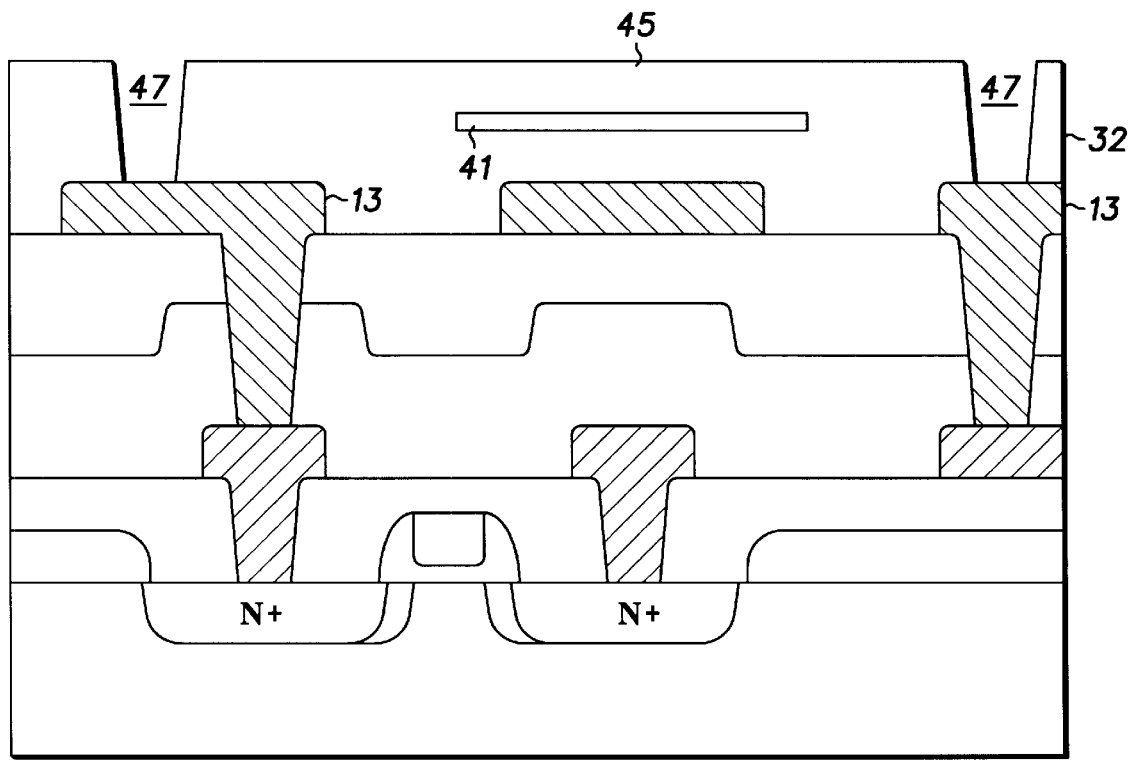
Figure 7:
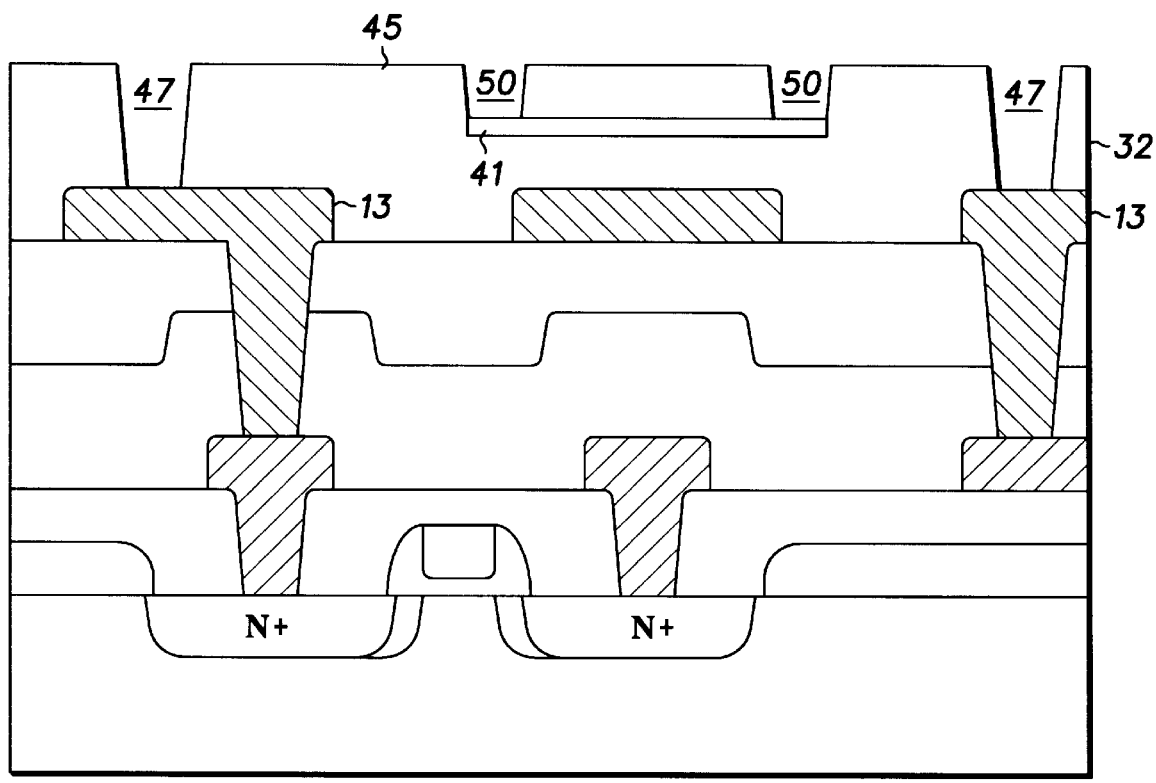

After suitably forming dielectric cap 45, via openings 47 are formed through dielectric cap 45 and dielectric system 32 to metal interconnects 13, as illustrated in FIG. 6. Because of the difference in dielectric thickness and requirements to protect GMR memory elements 41, via openings 47 to metal interconnects 13 are patterned and etched first. It should be noted, that because dielectric cap layer 45 completely protects GMR memory element 41 from oxidation or corrosive materials, the patterning and etching of vias 47 is performed using conventional methods, such as conventional photolithography and reactive ion etch (RIE) techniques.

Subsequent to the patterning and etching of vias 47, via openings 50 are formed through dielectric cap 45 to magnetic memory element 41. Via openings 50 may overlap GMR memory element 41, that is, vias 50 may extend outside or intersect the end of GMR element 41. Generally, vias 50 are etched in two separate steps. The first step is to etch through the second (top) layer of cap 45, stopping in the barrier layer, or if an etch stop layer is included the etch is stopped in the etch stop layer. Conventional photoresist can be used as a mask in this step, since the barrier layer still protects GMR memory element 41 from oxidation and corrosion. The photoresist is then removed by traditional methods, such as wet strip and/or $O_2$ plasma ashing. The second (top) dielectric layer then forms a mask for the removal of the barrier layer. The barrier layer is removed with fluorine based chemistries, or other chemistries, which do not damage (oxidize or corrode) GMR element 41. Since the photoresists were previously removed, there is no requirement to expose GMR memory elements 41 to $O_2$ plasma ashing or other oxidizing or corroding materials.

In a somewhat different process, vias 47 and 50 are formed in a single operation. In this process, an etch stop layer is utilized as a passivation layer for GMR memory element 41 and is provided as a first layer of dielectric system 45. Via opening 50 must be enclosed by GMR memory element 41, that is the contact may not extend outside the ends of GMR memory element 41 to protect element 41 from the resist stripping processes and other oxidizing or corrosive agents. This method of incorporating an etch stop layer as the passivation layer in GMR memory element 41 simplifies the via and interconnect processing. The etch stop and passivation layer can be formed by using a material that is unreactive to oxide and silicon nitride RIE etches. Suitable materials for the etch stop and passivation layer are CrSi, Ni, NiFe, or NiO, which layers may be deposited over a Ta or TaN layer.

The contact process for this structure is simplified to one photolithography step to pattern via openings 50 over GMR memory element 41 and via openings 47 over interconnects 13 simultaneously. The RIE etch processing is of sufficiently low power to prevent the sputter or physical removal of the etch stop and passivation layer over GMR memory element 41 in vias 50. In instances where the etch stop and passivation layer is electrically conductive, contact metal (to be explained presently) can simply be deposited in contact therewith in vias 50.

Figure 8:
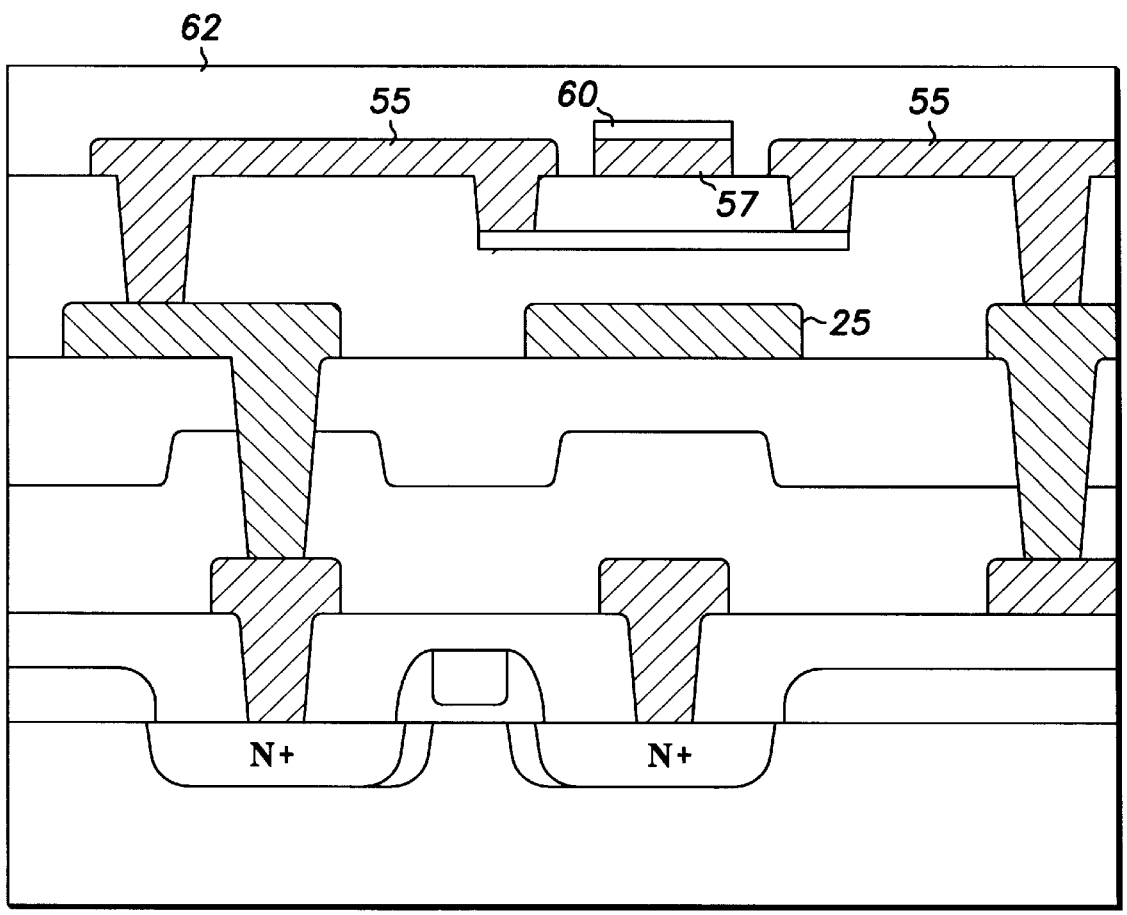

After the formation of vias 47 and 50, by either of the above described means, a metal system 55 is deposited through vias 47 to metal interconnects 13 and through vias 50 to opposite ends of magnetic memory cell 41, as illustrated in FIG. 8. In the preferred embodiment, metal system 55 is deposited by PVD and is patterned and etched using conventional technology. Metal system 55 forms a sense line, connecting GMR memory elements in rows, for example, and in series with drain electrode 16 of semiconductor device 11.

A top word line section 57 is also formed during this metallization step and vias (not shown for simplicity) connect ends of bottom word line sections 25 to ends of top word line sections 57 so as to form a continuous helical winding, or loop, around GMR memory element 41. This helical winding, or loop, provides a factor of 2 improvement in magnetic field generation over a single word line above or below GMR memory element 41, for the same amount of current. The metal system may also contain a flux concentrating layer 60 on top of top word line section 57 to improve the magnetic field generated by top word line section 57. Flux concentrating layer 60 can also be deposited separately after metal system 55 is patterned and etched. Three sides of top word line section 57 can be covered by using a separate deposition step for flux concentrating layer 60, which further improves the effectiveness of layer 60.

The patterning of separate flux concentrating layer 60 can be performed in any of three methods. In a first method, after the deposition of the flux concentrating layer, a mask is formed by an oversized top word metal line section and used to pattern and etch the flux concentrating layer. In a second method, an oversized reverse image of the top metal word line section is formed in resist. The flux concentrating layer is deposited and, using a lift-off process, the unwanted material is removed. Both of these methods suffer from pattern overlays problems, but are simpler in the number of process steps required. A third method is a self aligned method which overcomes the overlay problems. In this method the flux concentrating layer is deposited as the last layer of metal system 55. Metal system 55 is then patterned and etched and a second deposition of flux concentrating material is performed. A side wall dielectric is then formed by deposition and etch. The side wall forms a mask on the side of the metal. The flux concentrating material is then etched away leaving the flux concentrating material on the side walls and on the top of word line section 57.

A passivation layer 62 is deposited over metal system 55 and flux concentrating layer 60, if included. Any conventional passivation layer can be used as layer 62. Also, openings are cut in passivation layer 62 for the purpose of probing and making electrical contacts to the various circuits. A final low temperature forming gas anneal is done in this preferred embodiment to recover charge at the $SiO_2$/silicon interface.

Figure 9:
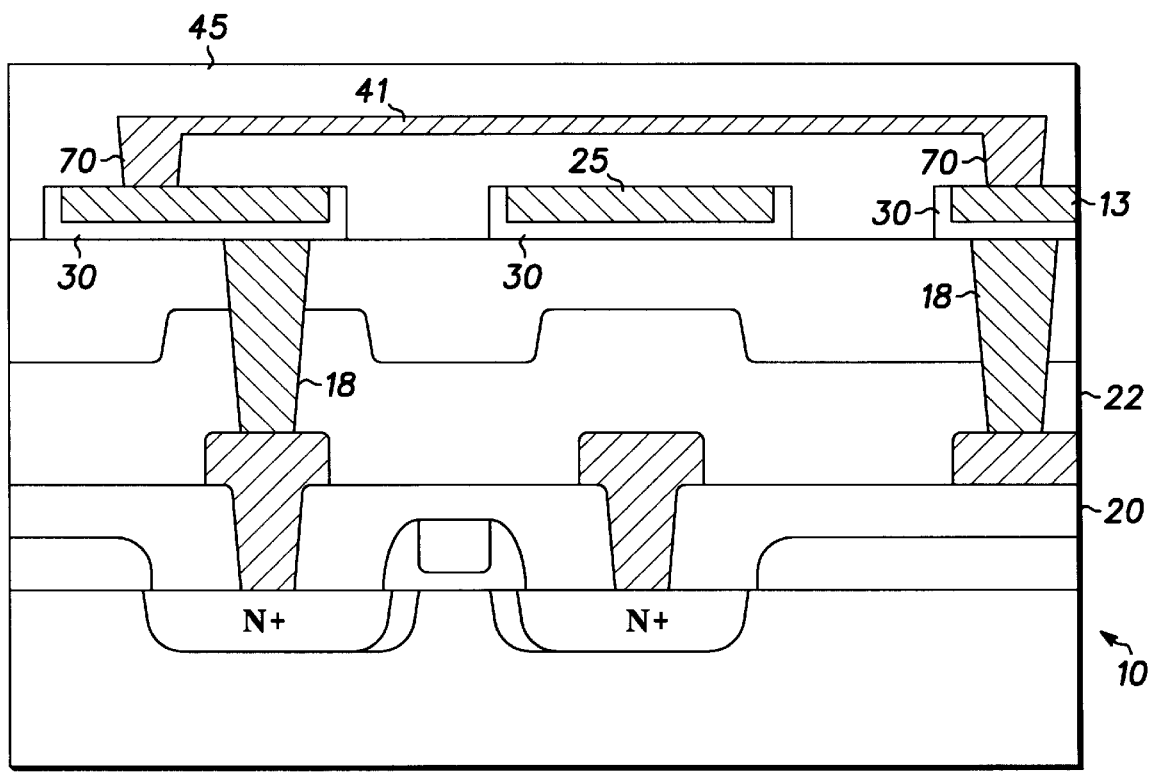
FIG. 9 is a simplified sectional view illustrating another embodiment in a method of fabricating magnetic memory devices in accordance with the present invention.

Another method of fabricating interconnect layers to GMR memory element 41 utilizes interconnects 70 underneath GMR memory element 41, illustrated in FIG. 9. The processing sequence for this method of fabrication utilizes similar processing steps as those previously described up to the formation of the second level of metallization (bottom word line section 25 and interconnects 13). The second level metal layer is fabricated with the preferred method being the damascene process described above in conjunction with FIG. 3. As is the case in the previous embodiments, the second level metal may provide for a single or multiple word lines under GMR memory element 41.

A dielectric layer (illustrated as a portion of dielectric system 45 in FIG. 9) is then deposited on top of the second metal layer. Via holes are then patterned and etched into the dielectric layer. Metal is then deposited, preferably by CVD methods, to fill the open via holes and form interconnects 70. Suitable metals for this deposition are W, Al, Cu, or the like. The excess metal is then removed from the top surface of the dielectric, a preferred method of metal removal being chemical mechanical polishing (CMP). After the polishing operation, the surface is flat and has a surface roughness consistent with the requirements of GMR deposition (i.e., a roughness in a range of 1 Å to 20 Å RMS and a maximum roughness of 50 Å). Since GMR memory element 41 is not present at this time, none of this procedure effects it.

GMR material is then deposited, patterned, and etched using methods described previously herein. This method of forming interconnects to GMR element 41 has the advantages of reduced photolithography and material depositions. Also, this fabrication method eliminates the via holes through dielectric system 45 covering GMR memory element 41 and exposure to corrosive or oxidizing agents is reduced.

Another method of depositing flux concentrator 30 utilizes ferrite materials as flux concentrator 30. Ferrite materials have high permeability and high electrical resistivity. Electrical resistivity of ferrite materials may be 6 to 8 orders of magnitude higher than materials used as conductors. Ferrite materials may be deposited directly over the patterned metal conductors in a blanket layer. The ferrite material then forms a flux concentrating layer on three sides of the conductors without the need to pattern and etch the formed flux concentrator. This method has the advantage of simplicity in reducing process steps while still providing flux concentrator structure 30 for improved magnetic field generation over GMR memory element 41. Suitable ferrite materials are: Mn—Zn—Ferrite, Ni—Zn—Ferrite, MnFeO, and NiFeO.

It will of course be understood that in some applications it may be desirable to simply utilize a single word line above or below GMR memory element 41 and some of the process will change accordingly. For example, if a single word line is used above GMR memory element 41, dielectric layers 22 and the second metallization step, including interconnects 13 and bottom word line section 25, can be eliminated. In that instance, dielectric system 32, with planar surface 33, is positioned directly on the surface of layer 20 and terminals (contacts) 16 and 17.

Accordingly an improved method of fabricating memories containing GMR materials with CMOS circuits is disclosed. Further, the present invention provides a new and improved method of fabricating memories containing GMR materials in which the GMR materials are protected from high temperatures and corrosive materials normally utilized in CMOS procedures. Also, the present invention provides a new and improved method of fabricating memories containing GMR materials in which the magnetoresistive ratio of the GMR materials is maximized to improve memory performance.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating magnetic memory devices comprising the steps of:

providing a substrate structure with a semiconductor device formed therein, the substrate structure having a surface with metal interconnects connected to the semiconductor device;

forming a dielectric system on the surface and on the metal interconnects, the dielectric system being formed with a planar surface having a roughness in a range of 1 Å to 20 Å RMS;

disposing and patterning films of giant magneto-resistive material on the planar surface of the dielectric system so as to form at least one magnetic memory cell;

disposing a dielectric cap on the magnetic memory cell so as to seal the cell and provide a barrier to subsequent operations;

forming vias through the dielectric cap and the dielectric system to the metal interconnects;

forming vias through the dielectric cap to the magnetic memory cell; and depositing a metal system through the vias to the metal interconnects and through the vias to the magnetic memory cell.

2. A method of fabricating magnetic memory devices as claimed in claim 1 wherein the step of providing the substrate structure includes providing a substrate structure having a surface with metal interconnects and a word line section.

3. A method of fabricating magnetic memory devices as claimed in claim 1 wherein the step of providing the substrate structure includes providing a substrate structure having a surface with metal interconnects and a word line section including a flux concentrating layer of permeable magnetic material.

4. A method of fabricating magnetic memory devices as claimed in claim 1 wherein the step of forming the dielectric system with a planar surface includes polishing the surface by dielectric chemical mechanical polishing.

5. A method of fabricating magnetic memory devices as claimed in claim 4 wherein the step of forming the dielectric system with a planar surface includes polishing the surface to a maximum roughness of 50 Å.

6. A method of fabricating magnetic memory devices as claimed in claim 1 including the step of performing a forming gas anneal on the substrate structure and dielectric system prior to the step of disposing and patterning films of giant magneto-resistive material.

7. A method of fabricating magnetic memory devices as claimed in claim 6 wherein the step of forming the dielectric system includes forming the dielectric system with at least one layer of material which provides a barrier for moisture and oxidation.

8. A method of fabricating magnetic memory devices as claimed in claim 7 wherein the step of forming the dielectric system with at least one layer of material includes forming a layer of silicon nitride (SiN) by one of plasma enhanced chemical vapor deposition (PECVD) or physical vapor deposition (PVD).

9. A method of fabricating magnetic memory devices as claimed in claim 1 wherein the step of performing the forming gas anneal on the dielectric system includes annealing the dielectric system in an inert gas atmosphere at a temperature in the range of 390° C. to 450° C. for a time in the range of 15 minutes to 30 minutes.

10. A method of fabricating magnetic memory devices as claimed in claim 6 wherein the step of disposing and patterning films of giant magneto-resistive material on the planar surface of the dielectric system includes depositing consecutive films of giant magneto-resistive material on the planar surface of the dielectric system, forming a layer of material which forms a barrier to moisture and oxidation, patterning the layer of material to form a hard etch mask, removing unmasked portions of the consecutive films of giant magneto-resistive material by one of ion milling or wet etching.

11. A method of fabricating magnetic memory devices as claimed in claim 10 wherein the step of forming the layer of material which forms a barrier to moisture and oxidation includes forming a layer of silicon nitride (SiN) by one of plasma enhanced chemical vapor deposition (PECVD) or physical vapor deposition (PVD).

12. A method of fabricating magnetic memory devices as claimed in claim 10 wherein the step of removing unmasked portions of the consecutive films of giant magneto-resistive material by one of ion milling or wet etching includes removing unmasked portions by wet etching utilizing one of diluted nitric acid, sulfuric acid, or HCl.

13. A method of fabricating magnetic memory devices as claimed in claim 1 wherein the step of disposing the dielectric cap on the magnetic memory cell includes forming a barrier layer of material which forms a barrier to moisture and oxidation, and forming a top dielectric layer overlying the barrier layer.

14. A method of fabricating magnetic memory devices as claimed in claim 13 wherein the step of forming vias through the dielectric cap to the magnetic memory cell includes the steps of masking and etching through the top dielectric layer, removing the masking, and etching through the barrier layer using the top dielectric layer as a mask and using fluorine based chemistries.

15. A method of fabricating magnetic memory devices as claimed in claim 1 wherein the step of disposing the dielectric cap on the magnetic memory cell includes the step of forming a passivation layer on the magnetic memory cell, and the step of forming vias through the dielectric cap to the magnetic memory cell includes forming vias through the dielectric cap to the passivation layer with the step of forming vias through the dielectric cap and the dielectric system to the metal interconnects.

16. A method of fabricating magnetic memory devices as claimed in claim 15 wherein the step of forming the passivation layer on the magnetic memory cell includes forming a layer on the magnetic memory cell which is unreactive to oxide and silicon nitride reactive ion etches.

17. A method of fabricating magnetic memory devices as claimed in claim 16 wherein the step of forming the passivation layer on the magnetic memory cell further includes forming a layer of electrically conductive material on the magnetic memory cell.

18. A method of fabricating magnetic memory devices as claimed in claim 17 wherein the step of forming the passivation layer of electrically conductive material includes forming a layer with one of CrSi, Ni, and NiFe.

19. A method of fabricating magnetic memory devices as claimed in claim 6 wherein the step of depositing the metal system includes depositing the metal by physical vapor deposition.

20. A method of fabricating magnetic memory devices as claimed in claim 1 wherein the step of depositing the metal system includes forming a word line section adjacent the magnetic memory cell.

21. A method of fabricating magnetic memory devices as claimed in claim 1 wherein the step of depositing the metal system includes forming a word line section including a flux concentrating layer of permeable magnetic material adjacent the magnetic memory cell.

22. A method of fabricating magnetic memory devices as claimed in claim 1 including the step of depositing a passivation system over the metal system.

23. A method of fabricating magnetic memory devices comprising the steps of:

providing a substrate structure with a semiconductor device formed therein, the substrate structure having a surface with metal interconnects connected to the semiconductor device and a bottom word line section;

forming a dielectric system on the surface and on the metal interconnects, the dielectric system being formed with a planar surface having a roughness in a range of 1 Å to 20 Å RMS and a maximum roughness of 50 Å, the dielectric system including at least one layer of silicon nitride (SiN) formed by one of plasma enhanced chemical vapor deposition (PECVD) or physical vapor deposition (PVD);

performing a forming gas anneal on the substrate structure and the dielectric system including annealing the dielectric system in an inert gas atmosphere at a temperature in the range of 390° C. to 450° C. for a time in the range of 15 minutes to 30 minutes;

subsequent to the step of performing the forming gas anneal, disposing and patterning films of giant magneto-resistive material on the planar surface of the dielectric system including depositing consecutive films of giant magneto-resistive material on the planar surface of the dielectric system, forming a layer of material which forms a barrier to moisture and oxidation, patterning the layer of material to form a hard etch mask, removing unmasked portions of the consecutive films of giant magneto-resistive material by one of ion milling or wet etching so as to form at least one magnetic memory cell;

disposing a dielectric cap on the magnetic memory cell including forming a barrier layer of material which forms a barrier to moisture and oxidation so as to seal the cell and provide a barrier to subsequent operations, and forming a top dielectric layer overlying the barrier layer;

forming vias through the dielectric cap and the dielectric system to the metal interconnects and to the bottom word line section;

forming vias through the dielectric cap to the magnetic memory cell including the steps of masking and etching through the top dielectric layer, removing the masking, and etching through the barrier layer using the top dielectric layer as a mask and using fluorine based chemistries; and depositing a metal system through the vias to the metal interconnects and the bottom word line section and through the vias to the magnetic memory cell, and forming a top word line section adjacent the magnetic memory cell and in contact with the via to the bottom word line section; and depositing a passivation system over the metal system.

24. A method of fabricating magnetic memory devices as claimed in claim 23 wherein the step of providing the substrate structure with the semiconductor device formed therein includes providing a substrate structure with a field effect transistor formed therein, the field effect transistor including a silicon gate on a silicon oxide gate insulator.

25. A method of fabricating magnetic memory devices comprising the steps of:

providing a substrate structure with a semiconductor device formed therein, the substrate structure having a surface with metal interconnects connected to the semiconductor device;

forming a dielectric on the surface of the substrate structure and on the metal interconnects, the dielectric defining a supporting surface;

forming vias through the dielectric from the supporting surface to the metal interconnects;

depositing a metal system through the vias to the metal interconnects to provide electrical contacts in the supporting surface;

disposing and patterning films of giant magneto-resistive material on the supporting surface of the dielectric so as to form at least one magnetic memory cell in electrical communication with the electrical contacts in the supporting surface; and disposing a dielectric system on the magnetic memory cell so as to seal the cell and provide a barrier to ambient conditions.

26. A method of fabricating magnetic memory devices as claimed in claim 25 wherein the step of depositing the metal system includes providing the supporting surface with a planar surface having a roughness in a range of 1 Å to 20 Å RMS.

27. A method of fabricating magnetic memory devices as claimed in claim 25 wherein the step of providing the substrate structure with a semiconductor device formed therein, the substrate structure having a surface with metal interconnects, includes providing the substrate structure with a bottom word line section.

28. A method of fabricating magnetic memory devices as claimed in claim 27 including, subsequent to the step of disposing the dielectric system on the magnetic memory cell, the steps of forming vias through the dielectric system to the bottom word line section, depositing a metal system through the vias to the bottom word line section, and forming a top word line section adjacent the magnetic memory cell and in contact with the via to the bottom word line section, and depositing a passivation system over the metal system.

29. A method of fabricating magnetic memory devices as claimed in claim 28 including, prior to the step of depositing the passivation system, forming a flux concentrating layer on the top word line section.

30. A method of fabricating magnetic memory devices as claimed in claim 29 wherein the step of forming the flux concentrating layer on the top word line section includes forming the flux concentrating layer of non-conducting, permeable magnetic material.

* * * * *

UNITED STATES PATENT AND TRADEMARK OFFICE
CERTIFICATE OF CORRECTION

PATENT NO. : 5,861,328 Page 1 of 1
DATED : January 19, 1999
INVENTOR(S) : Tehrani et al.

It is certified that error appears in the above-identified patent and that said Letters Patent is hereby corrected as shown below:

Column 1,
Line 2, after the Title, please add as a new first paragraph the following paragraph:
-- This invention was made with Government support under Agreement No. MDA972-96-3-0016 awarded by DARPA. The Government has certain rights in the invention. --

Signed and Sealed this

Nineteenth Day of August, 2003

JAMES E. ROGAN
*Director of the United States Patent and Trademark Office*